US011476030B2

(12) United States Patent
Scholz

(10) Patent No.: US 11,476,030 B2
(45) Date of Patent: Oct. 18, 2022

(54) ELECTRIC MODULE WITH A PLANAR TRANSFORMER

(71) Applicant: Phoenix Contact GmbH & Co. KG, Blomberg (DE)

(72) Inventor: Peter Scholz, Brakel (DE)

(73) Assignee: Phoenix Contact GmbH & Co. KG, Blomberg (DE)

(*) Notice: Subject to any disclaimer, the term of this patent is extended or adjusted under 35 U.S.C. 154(b) by 413 days.

(21) Appl. No.: 16/641,172

(22) PCT Filed: Aug. 22, 2018

(86) PCT No.: PCT/EP2018/072668
§ 371 (c)(1),
(2) Date: Feb. 21, 2020

(87) PCT Pub. No.: WO2019/038329
PCT Pub. Date: Feb. 28, 2019

(65) Prior Publication Data
US 2020/0203053 A1 Jun. 25, 2020

(30) Foreign Application Priority Data
Aug. 22, 2017 (BE) .................................. 2017/5577

(51) Int. Cl.
H01F 27/00 (2006.01)
H05K 1/14 (2006.01)
(Continued)

(52) U.S. Cl.
CPC ........... *H01F 27/027* (2013.01); *H01F 27/06* (2013.01); *H01F 27/2804* (2013.01);
(Continued)

(58) Field of Classification Search
CPC .... H01F 27/027; H01F 27/06; H01F 27/2804; H05K 1/141; H05K 1/142
See application file for complete search history.

(56) References Cited

U.S. PATENT DOCUMENTS 5,644,103 A 7/1997 Pullen et al.
2014/0218155 A1 8/2014 Akre et al.
2016/0088754 A1 3/2016 Francis

FOREIGN PATENT DOCUMENTS

DE 19835641 A1 2/2000
DE 102015108911 A1 12/2016
(Continued)

OTHER PUBLICATIONS

Authorized Officer: Nora Lindner, English Translation of International Preliminary Report on Patentability issued in counterpart PCT application No. PCT/EP2018/072668, dated Feb. 25, 2020, 7 pp.

(Continued)

Primary Examiner — Jeremy C Norris
(74) Attorney, Agent, or Firm — Kaplan Breyer Schwarz, LLP

(57) ABSTRACT

An electric module with a planar transformer has a housing with an interior having an internal length and an internal height. The electric module additionally has a main printed circuit board with a first thickness, the main printed circuit board being equipped with at least one electronic component. The planar transformer is arranged on an additional printed circuit board with a second thickness, and the main printed circuit board has a recess which receives the additional printed circuit board. Additionally, the main printed circuit board and the additional printed circuit board are connected together via a connection.

15 Claims, 5 Drawing Sheets

(51) Int. Cl.
　　　*H01F 27/02*　　　(2006.01)
　　　*H01F 27/06*　　　(2006.01)
　　　*H01F 27/28*　　　(2006.01)
(52) U.S. Cl.
　　　CPC .............. *H05K 1/141* (2013.01); *H05K 1/142* (2013.01); *H01F 2027/065* (2013.01); *H01F 2027/2819* (2013.01); *H05K 2201/086* (2013.01); *H05K 2201/09154* (2013.01); *H05K 2201/09845* (2013.01); *H05K 2201/1003* (2013.01)

(56)　　　　　　　References Cited

FOREIGN PATENT DOCUMENTS

| EP | 1986244 A2 | 10/2008 |
| EP | 2818031 B1 | 8/2013 |
| KR | 10-1177061 B1 | 8/2012 |

OTHER PUBLICATIONS

Authorized Officer: Kaveckaite, Ausra, International Search Report and Written Opinion issued in corresponding PCT application No. PCT/EP2018/072668, dated Nov. 26, 2018, 11 pp.

Fig. 9

| Voltage (peak value) | Clearance | | Isolation distance through casting compound | | Isolation distance through solid isolation | | Creepage distance in air | | Creepage distance under the protective layer | | Creepage current value (CTI)[a] | |
|---|---|---|---|---|---|---|---|---|---|---|---|---|
| 1 | 2 | | 3 | | 4 | | 5 | | 6 | | 7 | |
| V | Ia, Ib | Ic | Ia, Ib | Ic | Ia, Ib | Ic | Ia, Ib | Ic | Ia, Ib | Ic | Ia | Ib, Ic |
| Level of protection | | | | | | | | | | | | |
| 10 | 1.5 | 0.4 | 0.5 | 0.1 | 0.3 | 0.1 | 1.0 | 1.0 | 0.5 | 0.3 | — | 100 |
| 20 | 2.0 | 0.5 | 0.7 | 0.2 | 0.2 | 0.2 | 1.5 | 1.5 | 0.7 | 0.3 | 100 | 100 |
| 60 | 3.0 | 0.6 | 1.0 | 0.3 | 0.3 | 0.3 | 2.0 | 1.5 | 1.0 | 0.5 | 100 | 100 |
| 90 | 4.0 | 0.8 | 1.3 | 0.3 | 0.5 | 0.5 | 3.0 | 1.9 | 1.3 | 0.6 | 100 | 100 |
| 150 | 5.0 | 1.5 | 1.7 | 0.5 | 0.7 | 0.6 | 4.0 | 2.1 | 2.0 | 1.1 | 175 | 175 |
| 375 | 6.0 | 2.5 | 2.0 | 0.6 | 1.0 | 0.8 | 6.0 | 2.5 | 3.3 | 1.7 | 175 | 175 |
| 530 | 7.0 | 4.0 | 2.4 | 0.8 | 1.2 | 0.8 | 8.0 | 4.0 | 5.0 | 2.4 | 275 | 175 |
| 720 | 8.0 | 5.0 | 2.7 | 0.9 | 1.4 | 0.9 | 13.0 | 6.3 | 6.0 | 2.9 | 275 | 175 |
| 1000 | 10.0 | 7.0 | 3.3 | 1.1 | 1.7 | 1.1 | 18.0 | 10.0 | 6.3 | 4.0 | 275 | 175 |
| 1300 | 14.0 | 8.0 | 4.6 | 1.7 | 2.3 | 1.7 | 25.0 | 12.5 | 12.0 | 5.8 | 275 | 175 |
| 1570 | 16.0 | 10.0 | 5.3 | | 2.7 | | 36.0 | 13.0 | 16.3 | | 275 | 175 |
| 2.3k | 18.0 | 15.0 | 9.0 | | 4.5 | | 49.0 | 18.0 | | | | |
| 4.7k | 22.0 | | 12.0 | | 6.0 | | | 32.0 | | | | |
| 9.5k | 45.0 | | 20.0 | | 10.0 | | | 60.0 | | | | |
| 15.6k | 70.0 | | 33.0 | | 16.5 | | | 100.0 | | | | |

[a] The manufacturer must provide the evidence that the insulation meets the CTI requirements. In the case of voltage of up to 10 V, no creepage current value needs to be provided for insulation.

US 11,476,030 B2

ELECTRIC MODULE WITH A PLANAR TRANSFORMER

FIELD

The invention relates to an electrical module comprising a planar transformer.

BACKGROUND

Planar transformers are used, inter alia, for galvanic isolation of circuits, a planar transformer being a particular type of a transformer which is characterized by a particularly flat design. Planar transformers may have a design height in the millimeter range and are preferably used in electrical modules or electrical devices which are intended to be particularly compact with respect to the geometrical dimensions thereof. In this case, planar transformers can transfer energy, signals and/or data. The transformer property also makes it possible to interconnect circuits of different AC voltage levels.

EP 2818031 B1 describes a planar transformer which is designed so as to be particularly flat. This is achieved in that the individual windings of the planar transformer are arranged side-by-side in one plane instead of one above the other, as is conventional. As a result, the design height of the planar transformer can be further reduced.

Planar transformers having a low design height are particularly suitable for use for narrow electrical devices of a low design height. An electrical device of this kind is an isolation amplifier for example.

The structure and the use of a planar transformer in an isolation amplifier is known for example from DE 10 2015 108 911 A1.

A significant challenge in the case of narrow electrical devices such as isolation amplifiers is that of making the best possible use of the available volume within a housing, in order to be able to arrange as far as possible all the components in a manner having the required spacing and the associated conducting tracks. In this case, the overall height available inside the housing is particularly relevant for the mounting of circuit boards or printed circuit boards, since the boundaries of the housing specify a maximum mounting height.

A further aspect is that isolation amplifiers are often dimensioned for industrial applications. In this case, it is intended, for example, for sensors connected to the isolation amplifier to also be able to be used in zones at risk from explosion. Therefore, the isolation amplifiers used for this purpose are designed and dimensioned in accordance with relevant standards, e.g. according to DIN EN 60079-11. During the dimensioning, in addition to various safety aspects, special requirements for the isolation properties may be relevant, which properties are grouped into clearance and creepage distances to be adhered to, and solid isolation. In this case, table 5 of DIN EN 60079-11, e.g. the version EN 60079-11:2012, on table 5 of which the table of the accompanying FIG. 9 is based, is consulted for the dimensioning and geometrical design of planar transformers and isolation amplifiers. Table 5 specifies minimum values for clearance and creepage distances, as well as isolation distances which are to be adhered to in the case of air-isolated and solids-isolated spacings, in order to comply with a particular level of protection or a voltage class.

Table 5 of DIN EN 60079-11, version EN 60079-11:2012 specifies, for example in the 375 V voltage class, that the isolation distance in solid isolation in level of protection ia, ib must have a value of at least one millimeter (1.0 mm). This value is referred to as "isolation distance" or "T0." According thereto, the specified isolation distances T0 specify minimum spacings and are to be complied with in each case, in the components used in an electrical device. This also applies for example for conducting tracks of a circuit board, both in the horizontal direction (side-by-side on the same layer) and in the vertical direction (one above the other on different layers, having an insulating layer therebetween). According thereto, the specifications of the isolation distances T0 in isolation amplifiers or the transformers thereof must be met if they are intended to be dimensioned in accordance with the corresponding standard.

Nonetheless, a practical problem often arises when dimensioning electrical devices or electrical modules comprising a transformer, in particular a planar transformer. Even if the narrow transformer, dimensioned in accordance with the standards, in principle fits into an available cavity P0 of a narrow housing, for example a housing of an isolation amplifier, a particular thickness of a circuit board has to be used for the transformer, in order to ensure a desired level of protection. For example, according to the standard DIN EN 60079-11, e.g. according to the version EN 60079-11:2012 (cf. FIG. 9), a thickness of the circuit board of for example at least 1 mm is to be used, if what is known as the "375 V class" of table 5 of the standard DIN EN 60079-11 (cf. FIG. 9) is intended to be complied with, since there T0=1 mm is specified for this protection category. Transformers that comply with the minimum spacings described above are referred to as "intrinsically safe transformers." If all the minimum spacings with respect to an electrical module or an electrical device are complied with, the electrical module or device is referred to as "intrinsically safe."

According thereto, the criterion of intrinsic safety specifies a particular minimum thickness of a circuit board for a transformer. However, it is desirable to in general keep the thickness of the circuit board as low as possible, in order to be able to make the best possible use of the limited space inside a housing for mounting components on the circuit board with components, in particular for making use of the maximum possible mounting height.

SUMMARY

An object of the present invention is that of providing an electrical module comprising a planar transformer, in order to as far as possible meet safety requirements with respect to the planar transformer or the electrical module as a whole, and also to be able to make good use of the overall height within a housing of the electrical module.

This object is achieved by an electrical module having the features of claim 1. The dependent claims relate to preferred or expedient embodiments and developments.

Accordingly, the invention proposes an electrical module comprising a planar transformer, the electrical module comprising a housing having an interior. The interior of the housing has an internal height. Furthermore the electrical module comprises a main circuit board having a first thickness, at least one electronic component being arranged on the main circuit board. Furthermore, the planar transformer is arranged on an add-on circuit board of the second thickness, the main circuit board comprising a recess that receives the add-on circuit board. In this case, the main circuit board and the add-on circuit board are interconnected by a connection. Furthermore, both the main circuit board and the add-on circuit board can in each case comprise a plurality of electrically conductive and electrically insulating layers.

In the present context, a "circuit board" (circuit card, board, or printed circuit board, PCB) is to be understood as a carrier for electronic components. The circuit boards proposed here, for example a main circuit board and one or more add-on circuit boards, can be arranged in a common housing. The housing protects the inner structure of the electrical module. The housing can for example be cuboid or any desired geometrical shape that makes it possible to arrange the components of the electronic module inside an interior of the housing. In this case, the interior has a geometrical extension having a height, width and depth, it not being necessary for said variables to be the same size at all points inside the housing in each case, i.e. the housing can for example deviate from a rectangular base or cuboid geometry.

In the following context, the term "electrical module" is intended to be understood such that an electrical module can be part of a more complex electrical device. In this case, the electrical module is to be understood as a complete unit having its own housing which may comprise interfaces for electrical and/or mechanical contacting with further modules or electrical devices. Furthermore, an electrical module can be part of an electrical device.

Furthermore, it may also be possible that a plurality of modules can be assembled to form an overall unit, for example by arranging individual module housings in a row on a common electrical rail or by electrically interconnecting the modules to form a larger unit, for example an electrical device.

The module that is proposed according to the invention preferably has a housing overall height P1 or overall thickness in the vertical direction in the millimeter range, for example from approximately 0.5 cm to approximately 1.8 cm, or more, but as a maximum a few centimeters, preferably less than two centimeters. Housing overall heights of for example from approximately 3 mm to approximately 5 mm are also possible. Accordingly, for example 4.5 mm to approximately 1.6 mm, depending on the wall thickness of the housing, remains in the interior of the housing as the mounting overall height P0. The "mounting overall height" is understood as the extension of the module in the orthogonal direction, with respect to a circuit board arranged in the interior of the housing. A mounting overall height can be provided on both sides of the circuit board, i.e. from the relevant surface of the circuit board to the relevant inner delimitation of the housing of the module. Furthermore, the housing shape of the electrical module is preferably cuboid, so as to result in a constant mounting overall height along the main circuit board.

The circuit board has a thickness H0 of 1 mm for example. After the circuit board thickness H0 has been subtracted from the housing overall height P1, mounting overall heights P01 and P01 remain on either side of the circuit board, it being possible for the mounting overall to be less than 2 mm in each case.

It is proposed that the planar transformer should not be directly received on the main circuit board of the electrical module, but instead be arranged on an add-on circuit board. For this purpose, the main circuit board comprises a recess, the add-on circuit board being arranged in said recess. In this manner, the main circuit board can be replaced, in a predetermined region, by the add-on circuit board. Integrating the add-on circuit board into the surface of the main circuit board is advantageous in that the space in the interior of the housing of the electrical module is used in a compact manner, in order to arrange further mechanical components, such as plug connections, and electrical components and the planar transformer therein. Using an add-on circuit board is advantageous in that the isolation requirements can be met, even if the main circuit board does not have a sufficiently large thickness therefor.

Furthermore, using a main circuit board and an add-on circuit board makes it possible to fulfil a plurality of dimensioning criteria. The main circuit board can have a minimum first thickness in order to ensure the mechanical properties of the main circuit board. However, said first thickness would not be sufficient for ensuring the required minimum spacing T0 with respect to the planar transformer. Therefore, the planar transformer cannot be integrated into the module without additional measures, and is arranged on the add-on circuit board. The add-on circuit board has a minimum thickness in order to ensure the desired level of protection of the planar transformer. In addition to the mechanical requirements, said add-on circuit board is additionally dimensioned electrically with respect to a required minimum spacing T0.

It is furthermore advantageously possible for the connection between the main circuit board and the add-on circuit board to be designed in a step-like manner. A step can improve mechanical fixing, since the geometry of the step can provide a contact surface. Furthermore, a step is also suitable for establishing electrically safe contact. In this case, it is advantageously possible for the connection itself to be part of the main circuit board and/or the add-on circuit board. This means that, in such a case, no further component is used for providing a connection between the main circuit board and the add-on circuit board, but rather the geometry of the circuit boards provided is used for providing a connection. A step-like geometry is advantageous in that the step provides a contact surface or a lay-on surface, depending on the position of the step in the interior of the housing. In this case, "step" is understood to be a geometry which comprises a first surface having a first orientation, and a second surface having a second orientation, the first and the second surface being arranged so as to be at right-angles or approximately at right-angles to one another. In this case, the position of the two surfaces in space can be as desired, and may differ from a conventional step. Advantageously, one of the surfaces of the step-like geometry is oriented so as to be in parallel with a surface of one of the circuit boards. Furthermore, one of the surfaces of the step-like geometry is advantageously oriented so as to be at right-angles to a surface of one of the circuit boards.

It is furthermore advantageously possible for the connection to be formed by a step on the main circuit board. In this case it is possible, for example, for the step to be designed such that the add-on circuit board is supported on the main circuit board, and the step functions simultaneously as a mechanical stop for the add-on circuit board.

In addition or alternatively, it is advantageously possible for the connection to be formed by a step on the add-on circuit board. In this embodiment, for example the main circuit board can be supported on the add-on circuit board. If both the add-on circuit board and the main circuit board have a step-like geometry in the edge region thereof, the step-like geometries of the two circuit boards can form an interlocking geometry or a mutually supporting geometry, such that improved fixing is provided.

In a further embodiment it is possible for the connection to comprise an oblique contact surface. The oblique contact surface can be formed for example in an edge region of the main circuit board and/or the add-on circuit board. In this case, the oblique geometry can be formed in any desired angle, as an outer edge of the circuit board.

It is furthermore advantageously possible for the connection to be linear. A "linear connection" is to be understood as a connection that has a small contact surface and, ideally, is formed by a line when seen in a three-dimensional perspective. Said line appears as a point when viewed in cross-section, and provides a connection between the main circuit board and add-on circuit board. In a three-dimensional view, the punctiform connection in cross-section can be described as a linear connection or contact line in any desired spatial position. A contact line of this kind can be provided as a mechanical and/or electrical connection, for example as a depth milling, it being possible for the electrical contact to be achieved by metallization of the depth milling. Furthermore, a linear connection, in particular in the form of an electrical connection, can be provided for example by spot-welding or by a soldered connection. According thereto, a linear connection is advantageously used for establishing an electrical connection between two circuit boards. Furthermore it is also possible for the connection to be both an electrical and a mechanical connection. In such a case, the connection can provide mechanical stability and an electrical connection between the main circuit board and the add-on circuit board. The advantage of a linear connection is for example that the connection is established in a simple manner. It may be possible for said connection to be established cost-effectively and quickly.

In a further embodiment it is possible for the connection to comprise a contact surface. In this case, the contact surface can be arranged obliquely, vertically or perpendicularly inside the interior of the housing or with respect to one of the circuit boards. A "contact surface" is to be understood as a region that is planar at least in part and allows for contact between two circuit boards, at a plurality of points or one continuous surface. A contact surface can be provided by a step-like geometry for example, provided that the mating contact surface areally contacts the step-like geometry. A contact surface is advantageous in that the connection can be formed so as to be vibration-proof, which may be advantageous for example in an environment at risk from explosions.

A combination of a linear connection and a connection by means of a contact surface is also possible. It is thus possible, for example, for an areal connection to be provided in one region, while a linear connection is provided in a further region, the two connection types together forming the connection according to the invention between the main circuit board and the add-on circuit board.

In one embodiment it is advantageously possible for the connection to comprise a depth milling. In this connection, a depth milling is understood to be a mechanical depression which is designed in such a way as to be able to provide a connection. Thus, a depth milling is understood to be a perpendicular milling (z-axis milling), in which one or more non-vertical continuous depressions are milled. For example, the add-on circuit board comprises a depth milling which interacts with a corresponding geometry on the main circuit board and provides a connection. It may also be possible for the main circuit board to comprise a depth milling which interacts with a corresponding geometry on the add-on circuit board and provides a connection. A depth milling is advantageous for example in that it is easy to produce and in this case precise geometries can be produced.

In one embodiment it is advantageously possible for the main circuit board to be arranged centrally with respect to the internal height. This is advantageous in that components can be mounted, in the same manner, on both sides of the main circuit board can be fitted with components. Furthermore, contacting of the main circuit board to the outside can also be achieved in a simple manner, in that the housing comprises a recess through which the main circuit board can penetrate at least in part, in order, for example, to provide a plug connection of pluggable component mounting technology. The symmetrical arrangement of the main circuit board with respect to an internal height or with respect to an external height, as a result of uniform wall thicknesses of the housing, means that the contacting is also arranged centrally on the housing.

In an alternative embodiment it is possible, with respect to the position of the main circuit board, for the main circuit board to be arranged asymmetrically with respect to the internal height. This is advantageous in that particularly high components can be arranged on one side of the main circuit board, while components having a lower design height are arranged on the opposing side of the main circuit board. In this manner, high parts or components can be accommodated on the main circuit board, which parts or components would not have had sufficient space in the housing without this proposed arrangement of the main circuit board.

It is furthermore advantageously possible for the connection to provide an electrical and a mechanical connection. As a result, two functions are provided by one connection, which again saves space. The connection is located in the interior of the housing and is preferably established automatically.

It may furthermore be advantageous for the main circuit board and the add-on circuit board to comprise a common metallized contact surface. A contact surface of this kind is advantageous for a permanent connection between the main circuit board and the add-on circuit board. For example, the contact surface comprises copper material. Furthermore, the contact surface can be formed by one or a plurality of metal pads.

In an advantageous embodiment it may be possible for the first thickness of the main circuit board to be smaller than the second thickness of the add-on circuit board. Accordingly, the heights of the two circuit boards are different. Accordingly, the thickness of the main circuit board is designed in accordance with mechanical criteria and as thin as possible. This makes it possible for a larger mounting space to be provided on either side of the main printed circuit board. Furthermore, the add-on circuit board is subject to criteria for the design of the planar transformer, which is designed for example as an intrinsically safe planar transformer. In such a case, the thickness of the add-on circuit board is designed not only in accordance with mechanical criteria, but rather in addition also in accordance with electrical criteria, in order for example to comply with a particular level of protection. As a result, the height or thickness of the add-on circuit board will advantageously be greater than the height or thickness of the main circuit board.

It is furthermore advantageous for the main circuit board to be equipped with at least one component on either side, in each case. In this way, the space available in the interior of the housing of the electrical module is largely used.

According to a further preferred embodiment, the electrical module provides an isolation amplifier.

In this case, an isolation amplifier is understood to be an electrical unit that provides galvanic isolation of at least two circuits by means of a planar transformer, and at the same time provides a transmission ratio that is suitable for increasing voltage, current and/or signals. In the event of doubling of the voltage value, for example a transmission ratio, with respect to the values of input to output of the isolation amplifier, of 1:2 is used.

It may furthermore be possible for the isolation amplifier to be used in zones at risk of explosion. The proposed isolation amplifier for example complies with a standard required for this, such as standard DIN EN 60079-11, in particular values of a specified level of protection of the standard DIN EN 60079-11, e.g. version EN 60079-11:2012. According thereto, the isolation amplifier according to the invention is designed and dimensioned so as to take safety aspects into account, in particular in order to comply with requirements for isolation properties or minimum isolation spacings. For this purpose, the standard DIN EN 60079-11, e.g. version EN 60079-11:2012, specifies isolation properties and minimum spacings within the isolation amplifier and from the surroundings thereof, depending on a desired level of protection. In such a case, as a part of the isolation amplifier the planar transformer fulfils the requirements of the desired level of protection and can accordingly be designed as an "intrinsically safe planar transformer" or "intrinsically safe transformer." In this case "intrinsic safety" is to be understood as a technical term that is to be understood with respect to standardization, such as the standard DIN EN 60079-11, e.g. version EN 60079-11:2012.

Accordingly, an electrical module can be provided which has minimum isolation spacings, the minimum spacings being selected according to table 5 of DIN EN 60079-11, version EN 60079-11:2012, in particular the electrical module having an isolation distance of at least one millimeter. In such a case, it is possible to provide an intrinsically safe module, complying with the minimum spacings according to table 5 of DIN EN 60079-11, version EN 60079-11:2012, that can be used in zones at risk of explosion.

BRIEF DESCRIPTION OF THE DRAWINGS

Further features and advantages of the invention can be found in the following description of preferred embodiments, which is given purely by way of example and with reference to the accompanying drawings, in which drawings:

FIG. 9 is a table showing clearance and creepage distances and isolation distances with respect to particular levels of protection based on table 5 of the standard version EN 60079-11:2012 for the standard EN 60079-11;

DETAILED DESCRIPTION

Figure 1:
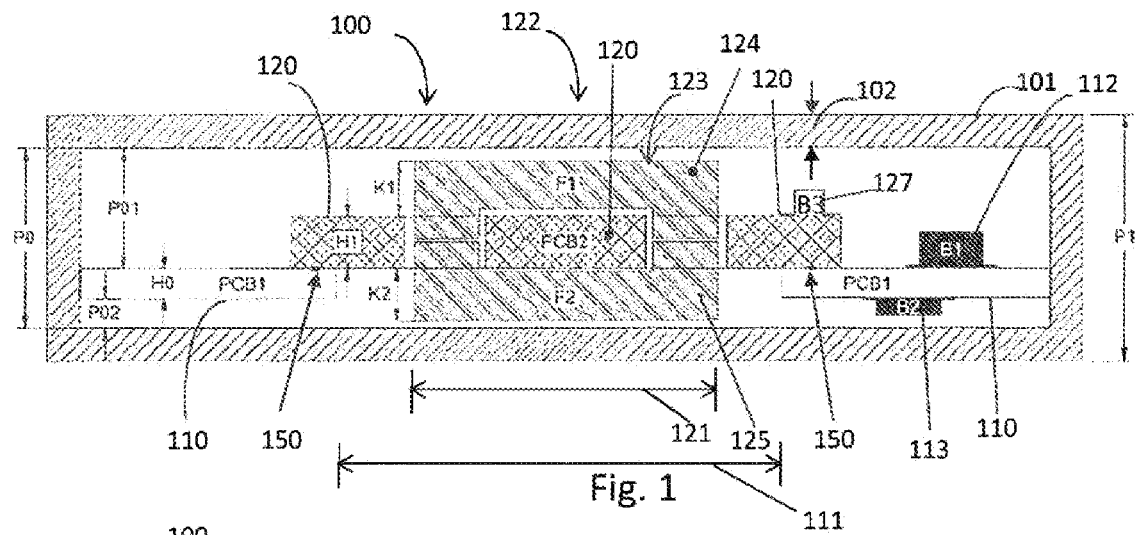
FIG. 1 is a cross-sectional view of a first embodiment of a design of an electronic module comprising a planar transformer, which module is within the scope of the invention.
Figure 2:
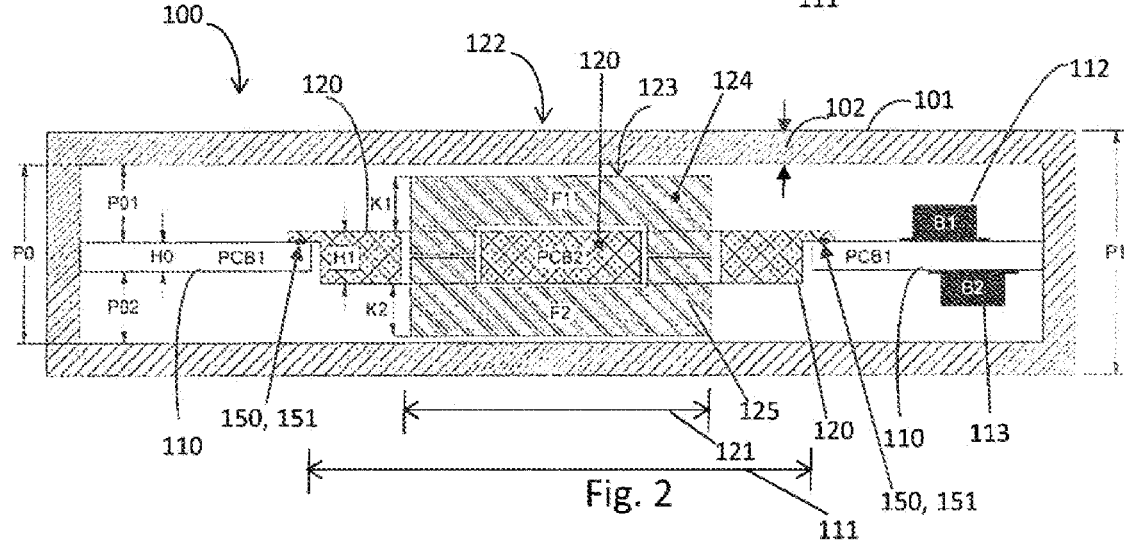
FIG. 2 is a cross-sectional view of a second embodiment of a design of an electronic module comprising a planar transformer, which module is within the scope of the invention.
Figure 3:
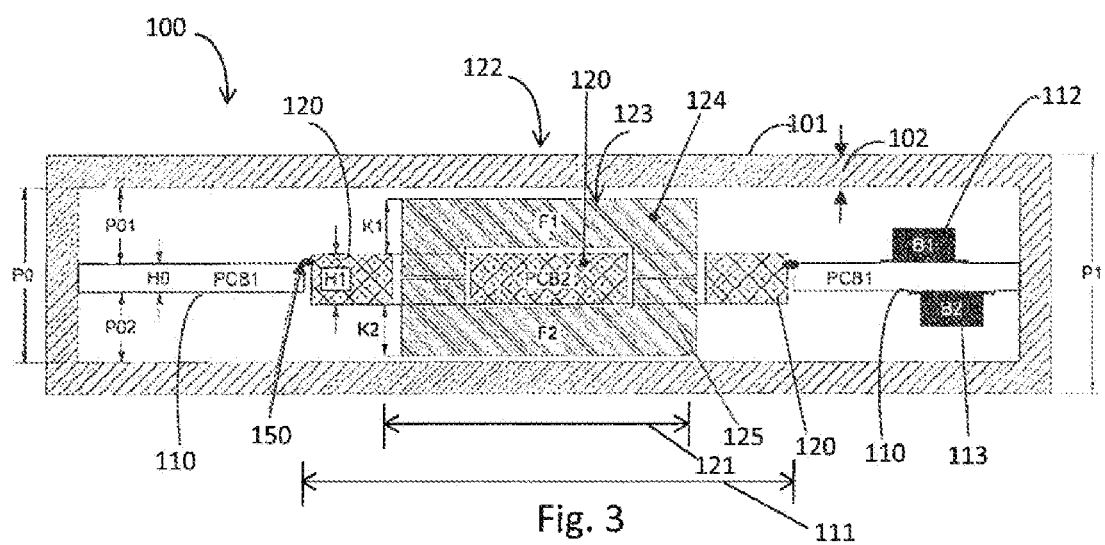
FIG. 3 is a cross-sectional view of a third embodiment of a design of an electronic module comprising a planar transformer, which module is within the scope of the invention.

In the following, reference is made to FIG. 1, FIG. 2 and FIG. 3, which each show a preferred embodiment of the invention. FIGS. 1 to 3 are each cross-sections of an electrical module 100, the embodiments of FIGS. 1 to 3 differing in the arrangement of the circuit boards and the connection 150 thereof to one another. The electrical modules 100 each comprise a housing in which a main circuit board 110 and an add-on circuit board 120 are arranged in each case.

Typically, at least one circuit board PCB1 or printed circuit board having a thickness of H0 is located in electrical modules or electrical devices of this kind having narrow housings, which circuit board is arranged more or less centrally in the available cavity of the housing, depending on the embodiment. Electronic components B1, B2 are mounted on the circuit board PCB1, which electronic components form the electronic functionality of the module or device. In order to make optimal use of the available space, the electronic components are often provided on both sides of the main circuit board 110. As shown in FIGS. 1 to 3, for example component B1 112 is arranged on the upper face and component B2 113 on the lower face of the main circuit board 110. Mounting on both sides means that the main circuit board PCB1 110 is often positioned more or less vertically in the center of the cavity, in order for the mounting heights P01 and P02 to be identical or approximately the same. Alternatively thereto, the main circuit board PCB1 110 can also be displaced in a slightly asymmetrical manner, in order that, for example, components 112, 113 of a greater height can be arranged on the upper face of the main circuit board 110, and components 112, 113 of a smaller height can be arranged on the lower face, with the result that different mounting heights are required. Furthermore, on the add-on circuit board 120 it is possible for components to also be arranged on the upper and/or lower face of the add-on circuit board. FIG. 1 shows a component 127 on the upper face of the add-on circuit board 120, by way of example.

More or less symmetrical positioning of the main circuit board 110 within the cavity of the housing 101 is advantageous if external terminals of the main circuit board 110 are intended to be designed such that metallizations on the main circuit board 110 are intended to establish direct contact in the plug connector. In this case, it is possible, for example, for the metal contacts of the main circuit board 110 to be pushed into a plug connector, outside or inside the housing 101.

The electrical modules shown in FIGS. 1 to 3 can be isolation amplifiers. Isolation amplifiers of this kind are provided in narrow housings.

The electrical modules of FIGS. 1 to 3 each have an external width P1 of for example approximately 6.2 mm. A cavity having an internal height P0 of for example approximately 4.5 mm is provided within the device. The cavity is enclosed for example by two housing parts having a wall thickness of for example approximately 0.85 mm.

In this case, it is possible for example for the main circuit board 110 to have a thickness H0 of for example approximately 0.8 mm. This results, in each case, in maximum mounting heights P01 and P02 within a cavity, of height P0, of the cuboid housing. The mounting heights P01 and P02 could be further increased if the thickness of the circuit board H0 were reduced. However, mechanical aspects, isolation requirements and the layer structure of the circuit board contradict this, with the result that a circuit board thickness of from approximately 0.5 mm to approximately 1.0 mm is typically selected. The mounting heights P01, P02 are for example each approximately 1.85 mm. In this case, manufacturing tolerances are generally also taken into account, and therefore individual values may be different.

A central component of isolation amplifiers is the transformer. Accordingly, almost every isolation amplifier comprises at least one transformer which is dimensioned in accordance with the standards in order to have a particular level of protection. In the region of a transformer, for example galvanically isolated windings, in solid isolation, must maintain at least the measurement T0 with respect to one another. Furthermore, the transformer of an isolation amplifier is preferably designed as a planar transformer. According to the invention, the planar transformer is arranged on an add-on circuit board which may have a circuit board thickness H1 of for example 1.5 mm, the main circuit board 110 of the isolation amplifier being designed having a circuit board thickness H0 of for example 0.8 mm. Accordingly, the following correlation results: H1>H0 and H1>T0, T0 being the required minimum spacing for a specific level of protection, e.g. 1 mm according to table 5 of the standard DIN EN 60079-11, e.g. the version EN 60079-11:2012 (cf. FIG. 9).

FIG. 1 is a cross-sectional view of a first embodiment of a design of an electronic module 100 comprising a planar transformer, which module is within the scope of the invention.

The planar transformer is manufactured as a component on an add-on circuit board PCB2 of thickness H1, which complies with all isolation requirements, such that the planar transformer can be used as an intrinsically safe planar transformer. Furthermore, the planar transformer comprises a ferrite core which comprises two ferrite core parts. The ferrite core parts of the planar transformer F1 and F2 protrude from the add-on circuit board in both directions, by the distance K1 and K2 in the vertical direction, resulting in an overall thickness of the transformer of K1+H1+K2. The overall thickness of the planar transformer may typically be for example approximately 4 mm. As a result, the planar transformer fits in the cavity P0 of for example approximately 4.5 mm.

The add-on circuit board has terminals on the outer layers thereof which are electrically and mechanically contacted with the main circuit board PCB1 110, for example via a connection 150 in the form of a solder connection. The planar transformer 122 is therefore an independent component that can be mounted for example in an SMT process, and essentially comprises, as a main component, the add-on circuit board PCB2 120, which also contains windings, as well as the two ferrite core parts F1 124 and F2 125. In this case, the two ferrite core parts 124 and 125 can be designed as carry-over parts, i.e. be of the same height, but this is not essential. Furthermore, in addition to the planar transformer the add-on circuit board can also accommodate further components B3, such as protective components (fuses, resistors, semiconductors, etc.) which are in particular likewise based on SMT technology. There may be many reasons for this. This measure thus makes it possible, for example, to make even better use of the available installation space, and in addition components B3 can be better thermally coupled to the transformer than if they were arranged on the main circuit board 110. This can be expedient for example for thermal monitoring of the transformer in the event of a malfunction.

The main circuit board PCB1 110 comprises a recess 111 for being able to receive the add-on circuit board via a connection. Furthermore, the add-on circuit board 120 comprises a recess 121 in the region of the transformer 122, through which recess one or both core halves can protrude, for example the lower core halves F2 125.

In the embodiment of FIG. 1, the main circuit board PCB1 110 is, however, not positioned vertically in the center of the cavity P0, but rather displaced downwards to such an extent that the mounting height P02 is smaller than the mounting height P01. Depending on the specific dimensioning, P02 can be so small that even the component B2 113, having a very small height, e.g. smaller than one millimeter (<1 mm), possibly can no longer be mounted at all.

In order to avoid this, a second embodiment according to FIG. 2 is furthermore proposed. In this case, the main circuit board PCB1 110 remains vertically centered or at least approximately vertically centered in the cavity or the interior of the housing 101 having the internal height P0, such that the mounting heights P01 and P02 are identical or at least approximately the same size, and there is sufficient space for both component B1 and component B2.

In this case, according to FIG. 2 what is known as a depth milling 151 is expediently made in the add-on circuit board PCB2 120, as a connection 150, which depth milling is dimensioned such that the electrical and mechanical connection between the two circuit boards 110, 120 is retained, e.g. by edge metallization, and at the same time is designed with respect to the tolerances such that the transformer body (of thicknesses H1+F1+F2) still fits in the cavity P0.

The design according to the second embodiment in FIG. 2 is advantageous inter alia in that it can be expediently produced using a machine, and also in that the circuit board PCB1 110 can remain more or less in the center of the cavity, which has advantages for the components B1 and B2 on either side of the circuit board.

FIG. 3 is a cross-sectional view of a third embodiment of a design of an electronic module 100 comprising a planar transformer 122, which module is within the scope of the invention. In this embodiment, the main circuit board PCB1 110 remains in a more or less central position, as does the add-on circuit board PCB2 120. However, the add-on circuit board PCB2 120 now no longer rests on the circuit board PCB1 110, as is the case in the embodiments of FIG. 1 and FIG. 2, but rather "floats" in a recess 111 of the main circuit board PCB1 110. This can be achieved for example by means of temporary retainers in the manufacturing process. In this position, the two circuit boards 110, 120 (PCB1 and PCB2) are mechanically and electrically interconnected, which can be achieved for example by means of solder connections. In the third embodiment, the add-on circuit board PCB2 120 may be more cost-effective compared with the second embodiment, since the depth milling 151 can be omitted.

Figure 4:
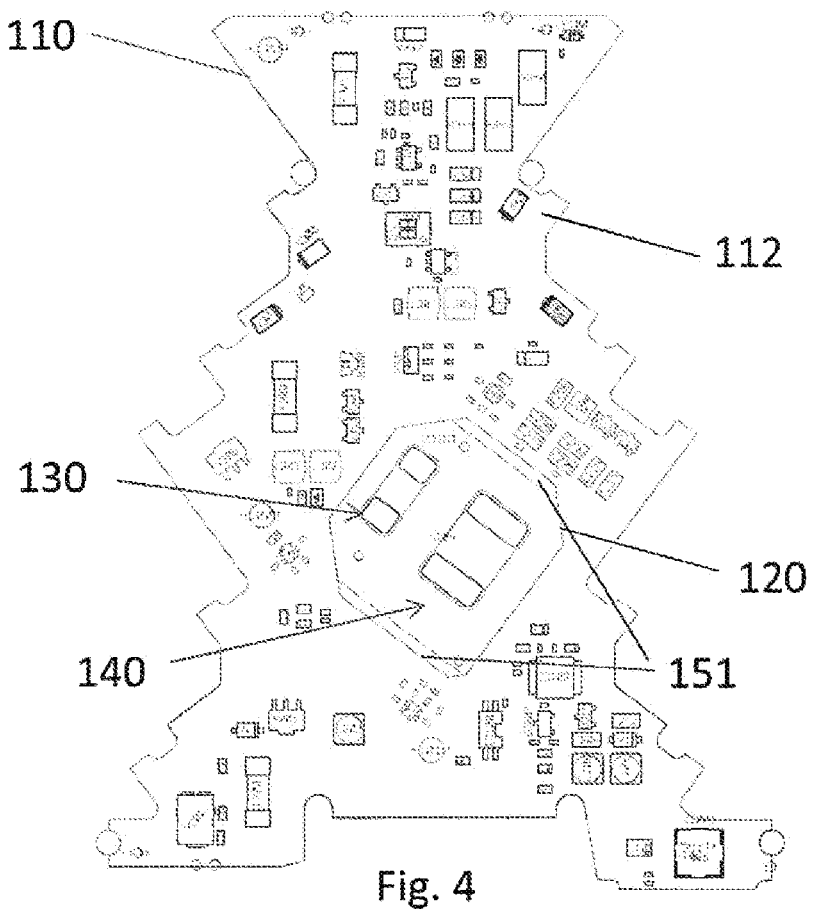
FIG. 4 is a plan view of an embodiment of an add-on circuit board that is integrated in a main circuit board.

FIG. 4 to FIG. 8 show further possible embodiments according to the invention. In this case, FIG. 4 shows a main circuit board PCB1 110 in an embodiment which is based on the second embodiment of FIG. 2. FIG. 5 to FIG. 8 furthermore show additional details.

FIG. 4 is a plan view of the interior of an electrical module 100, comprising a main circuit board 110 and an add-on circuit board 120. An add-on circuit board PCB2 120 comprising two planar transformers 130, 140 is attached to the main circuit board PCB1 110 of FIG. 4, which planar transformers each comprise a ferrite core pair F1 and F2, only the ferrite core part 131, 141 being visible in the plan view of FIG. 5. The main circuit board PCB1 110 has the layer structure 114 shown in FIG. 6, comprising four electrically conductive layers and intermediate isolating layers.

Figure 5:
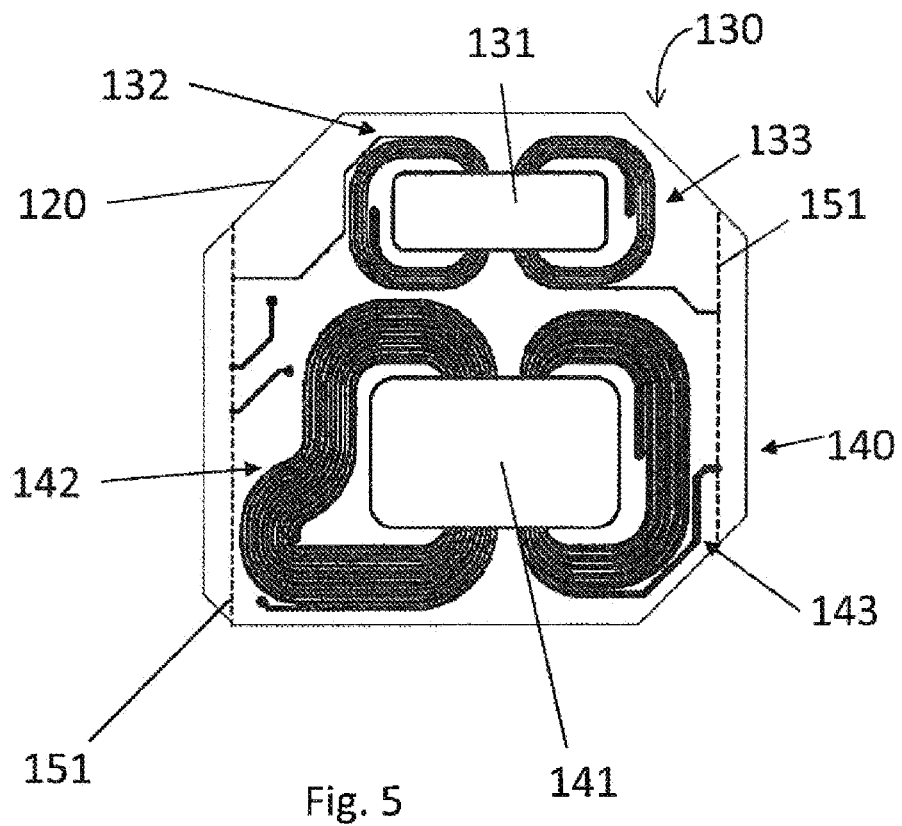
FIG. 5 is a plan view of the add-on circuit board of FIG. 4.

The add-on circuit board PCB2 120 of FIG. 4 and FIG. 5 comprises depth millings 151, in each case, on two edges. The depth millings 151 serve as the connection 150 between the main circuit board 110 and the add-on circuit board 120. Copper contacts or copper pads (optional edge metallizations) which can be soldered to the main circuit board PCB1 are provided on the depth millings 151.

Windings of the planar transformers 130, 140 are shown on an inside layer on the add-on circuit board PCB2 120 of FIG. 5. Further conducting tracks, which are also part of the individual windings and complete these, are provided on a further inside layer that is not shown in FIG. 5. Copper surfaces can be arranged on the outer layers, which surfaces can be used for shielding.

Figure 6:
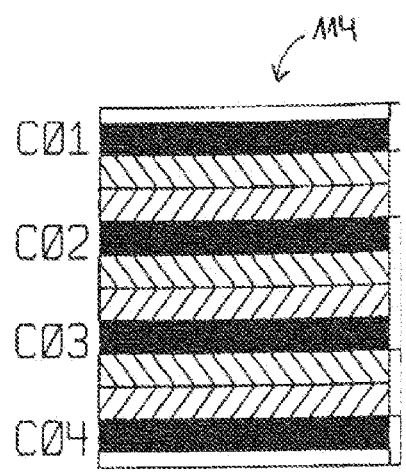
FIG. 6 is a cross-sectional view of an embodiment of a main circuit board.

FIG. 6 shows a layer structure of the main circuit board PCB1 which has a maximum thickness of approximately 0.9 mm for example. The individual layers, alternately copper and an isolating layer, have a thickness in the millimeter range, for example 35 µm in each case for a copper layer, and 200 µm in each case for an isolating layer, measured in the vertical direction of FIG. 6.

Figure 7:
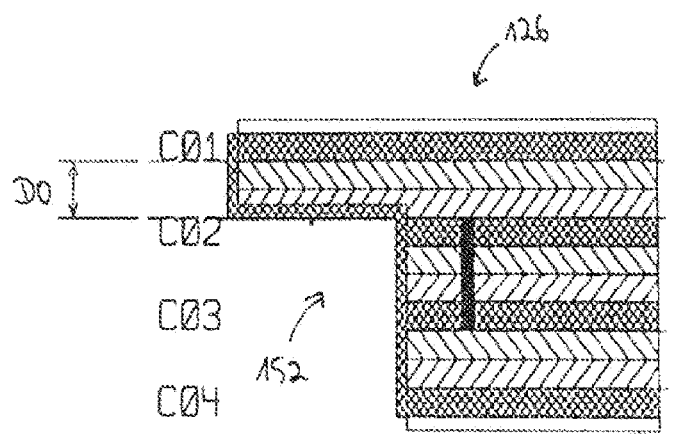
FIG. 7 is a cross-sectional view of an embodiment of an add-on circuit board comprising depth milling.

FIG. 7 shows a layer structure, by way of example, of the add-on circuit board of FIG. 4. The add-on circuit board PCB2 120 according to FIG. 7 has a layer structure 126, comprising four electrically conductive layers and intermediate isolating layers. The dimensions of the individual layers are similar to that in FIG. 6, specifically 35 µm in each case for a copper layer, and 200 µm to 600 µm in each case for an isolating layer, measured in the vertical direction of FIG. 7, it also being possible for vias to furthermore be provided between the individual layers, for the planar transformer. In this case, the layer structure comprising the four layers for example has a maximum thickness of approximately 1.45 mm, without the outer copper layers being taken into account. Furthermore, the add-on circuit board has a step-like geometry 152, on the lower face of which a metal contact surface in the form of edge metallization 153 is arranged, which surface is shown in FIG. 8.

Figure 8:
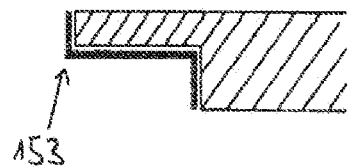
FIG. 8 shows the add-on circuit board of FIG. 7 comprising metal contacting.

FIG. 8 shows an embodiment comprising edge metallization 153, the metal in this case being copper (edge plated pads). The edge metallization 153 makes it possible in particular to provide electrical connections between the main circuit board and the add-on circuit board.

FIGS. 10 to 13 are cross-sectional views of further embodiments of an electrical module 100, in addition to FIGS. 1 to 3, FIGS. 10 to 13 showing only some of the components provided, and for example the housing 101 and the electronic components 112, 113 not being shown. FIGS. 10 to 13 each schematically show a main circuit board 110 and an add-on circuit board 120, the add-on circuit board 120 being surrounded, at least in part, by two core parts 124 and 125. In this embodiment, the main circuit board 110 has a smaller thickness in comparison with the add-on circuit board 120 which has a larger thickness or height.

FIGS. 10 to 13 show various variants of a type of the connection 150 between a main circuit board 110 and an add-on circuit board 120. In this case, each embodiment of FIGS. 10 to 13 in each case comprises two connections 150 which are each designed in an identical or similar manner. It is also possible, however, to combine different variants, such that for example a first connection 150 is formed in an electrical module 100 according to FIG. 10, and a second connection 150 is formed in an electrical module according to FIG. 12. Any desired variants are possible within the scope of the invention.

Figure 10:
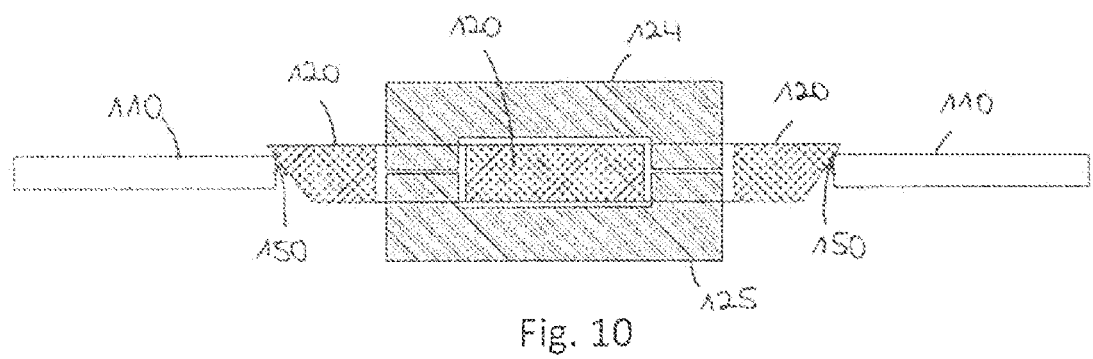
FIG. 10 is an embodiment of a connection having one oblique contact surface and one straight contact surface.

FIG. 10 shows an embodiment of a connection 150 between one straight contact surface of the main circuit board 110 and one oblique contact surface of the add-on circuit board 120. In this case, the contact surface in FIG. 10 extends upwards from the bottom, approximately at an angle of 45 degrees with respect to a horizontal orientation of the main circuit board 110. A blunt side of the connection surface rests on the lower edge of the add-on circuit board, and a tip of the connection surface rests on the upper edge of the add-on circuit board 120. In this case, the height of the add-on circuit board 120 exceeds the height of the main circuit board 110.

Figure 11:
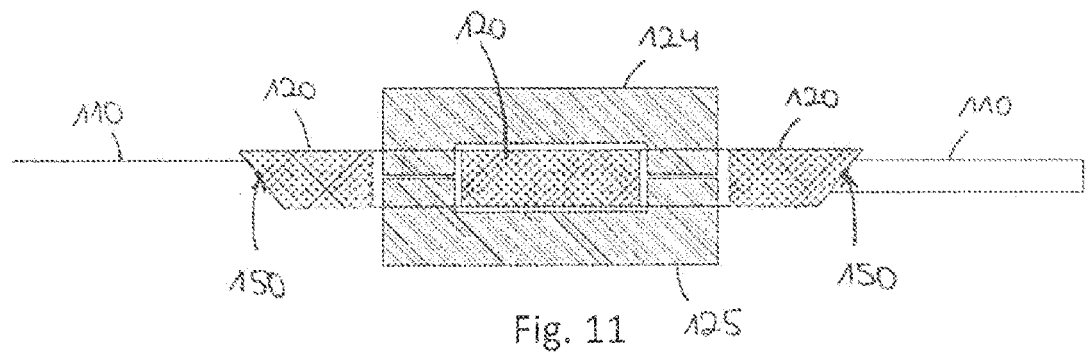
FIG. 11 is an embodiment of a connection having two oblique contact surfaces.

FIG. 11 shows an embodiment of a connection 150 having a common oblique contact surface of the main circuit board 110 and of the add-on circuit board 120. In this case, the main circuit board 110 also has an oblique edge surface, which corresponds to the oblique edge surface of the add-on circuit board, such that the two edge surfaces mechanically contact one another over the entire surface. In addition to the mechanical connection 150, an electrical connection 150 is provided, which is linear and is shown as a point in the cross-sectional view in FIG. 11.

Figure 12:
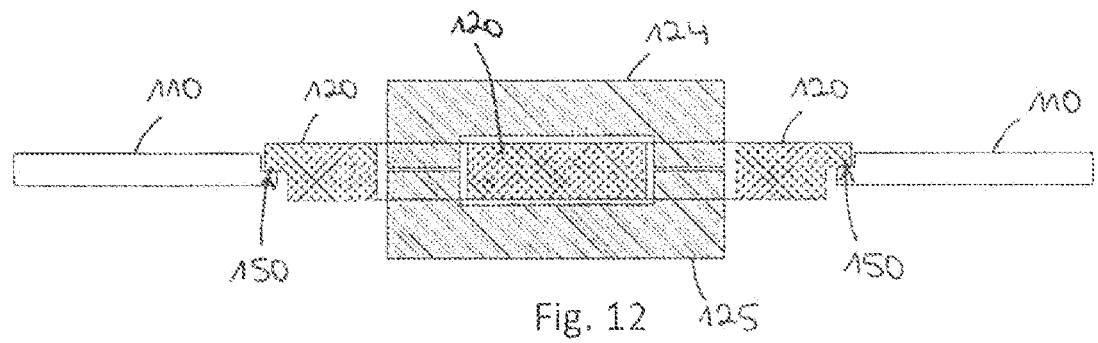
FIG. 12 is an embodiment of a connection having two step-like geometries.

FIG. 12 shows an embodiment of a connection 150 comprising a step-like mechanical contact surface and a linear electrical connection 150 at the step, which is shown as a punctiform connection in the cross-sectional view of FIG. 12. In this case, the edge region of the main circuit board 110 comprises a step which forms a contact surface upwards. The edge region of the add-on circuit board 120 furthermore comprises a step which forms a contact surface downwards. The two step-like geometries correspond to one another. In this case, the add-on circuit board 120 rests on the main circuit board 110, at the connection 150. Reversal of the support would also be possible, with the result that the main circuit board 110 rests on the add-on circuit board 120.

Figure 13:
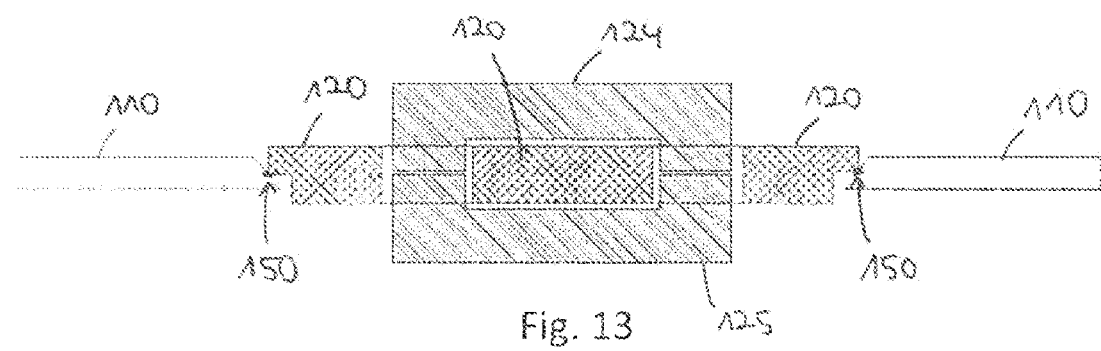
FIG. 13 is an embodiment of a connection having one oblique contact surface and a step-like geometry.

FIG. 13 shows an embodiment of a connection 150 in which the main circuit board 110 comprises an oblique contact surface in the edge region thereof. Furthermore, the add-on circuit board 120 has a step-like geometry at the edge region thereof. In this case, the two edge geometries of the two circuit boards 110, 120 are in mechanical contact only at one point or on one line, when the depth of the circuit boards 110, 120 is considered. At this point in the cross-sectional view, a connection 150 between the two circuit boards 110, 120 is provided, which connection acts both mechanically and electrically.

Overall, an electrical module 100 can be provided which comprises a main circuit board 110 and at least one add-on circuit board 120, it being possible for the main circuit board 110 and the add-on circuit board 120 to be electrically and mechanically interconnected. This connection 150 is advantageous in that the electrical module 100 can have a low design height overall, and at the same time can also be operated in an intrinsically safe manner, within the meaning of standard DIN EN 60079-11 or, at the international level, version EN 60079-11:2012.

LIST OF REFERENCE SIGNS 100 electrical module
101 housing
102 wall thickness
110 main circuit board PCB1
111 recess in the main circuit board
112 electronic component B1
113 electronic component B2
114 layer structure of the main circuit board comprising the layers C01, C02, C03, C04
120 add-on circuit board PCB2
121 recess in the add-on circuit board
122 first planar transformer
123 ferrite core
124 first ferrite core part F1 of the first planar transformer
125 second ferrite core part F2 of the first planar transformer
126 layer structure of the add-on circuit board comprising the layers C01, C02, C03, C04
127 electronic component B3
130 second planar transformer
131 ferrite core part of the second planar transformer
132 primary winding of the second planar transformer
133 secondary winding of the second planar transformer
140 third planar transformer
141 ferrite core part of the third planar transformer
142 primary winding of the third planar transformer
143 secondary winding of the third planar transformer
150 connection
151 depth milling
152 step-like geometry
153 edge metallization
H0 thickness of the circuit board or circuit board thickness
H1 thickness of the circuit board or circuit board thickness
K1 height of the ferrite core part F1
K2 height of the ferrite core part F2
P0 cavity height in the interior of the housing
P1 outside width of the housing
P01 mounting height in the interior of the housing
P02 mounting height in the interior of the housing
T0 required minimum spacing with respect to a level of protection

The invention claimed is:

1. An electrical module comprising a planar transformer, said module comprising a housing having an interior m having an internal height; a main circuit board having a first thickness, at least one electronic component being arranged on the main circuit board; wherein the planar transformer is arranged on an add-on circuit board having a second thickness; the main circuit board comprising a recess that accommodates the add-on circuit board; and the main circuit board and the add-on circuit board being interconnected via a connection.

2. The electrical module according to claim 1, wherein the connection is step-like.

3. The electrical module according to claim 1, wherein the connection is formed by a step on the main circuit board.

4. The electrical module according to claim 1, wherein the connection is formed by a step on the add-on circuit board.

5. The electrical module according to claim 1, wherein the connection comprises an oblique contact surface.

6. The electrical module according to claim 1, wherein the connection is linear.

7. The electrical module according to claim 1, wherein the connection comprises a contact surface.

8. The electrical module according to claim 1, wherein the connection comprises a depth milling.

9. The electrical module according to claim 1, wherein the main circuit board is arranged centrally with respect to the internal height.

10. The electrical module according to claim 1, wherein the main circuit board is arranged so as to be asymmetric with respect to the internal height.

11. The electrical module according to claim 1, wherein the connection provides an electrical and mechanical connection.

12. The electrical module according to claim 1, wherein the main circuit board and the add-on circuit board comprises a common metallized contact surface.

13. The electrical module according to claim 1, wherein the first thickness of the main circuit board is smaller than the second thickness of the add-on circuit board.

14. The electrical module according to claim 1, wherein at least one component is mounted on either side of the main circuit board in each case.

15. The electrical module according to claim 1, wherein the electrical module provides an isolation amplifier.

* * * * *